United States Patent [19]
Devin

[11] Patent Number: 5,622,879
[45] Date of Patent: Apr. 22, 1997

[54] METHODS FOR FABRICATING AND OPERATING ELECTRICALLY ERASABLE AND PROGRAMMABLE INTEGRATED CIRCUIT MEMORY

[75] Inventor: Jean Devin, Aix en Provence, France

[73] Assignee: SGS-Thomson Microelectronics, S.A., Gentilly Cedex, France

[21] Appl. No.: 456,143

[22] Filed: May 31, 1995

Related U.S. Application Data

[62] Division of Ser. No. 974,429, Nov. 12, 1992, Pat. No. 5,436,479.

[30] Foreign Application Priority Data

Nov. 13, 1991 [FR] France ............... 91 13946

[51] Int. Cl.$^6$ ............................. H01L 21/8247
[52] U.S. Cl. ............................. 438/266
[58] Field of Search ............... 437/43–44, 52

[56] References Cited

U.S. PATENT DOCUMENTS

| | | | |
|---|---|---|---|
| 4,122,544 | 10/1978 | McElroy | 365/185 |
| 4,361,847 | 11/1982 | Harari . | |
| 4,475,118 | 10/1984 | Klein et al. . | |
| 4,860,256 | 8/1989 | Devin et al. | 365/189.03 |
| 4,947,375 | 8/1990 | Gaultier et al. | 365/200 |
| 4,958,324 | 9/1990 | Devin | 365/201 |
| 4,964,079 | 10/1990 | Devin | 365/168 |
| 5,045,488 | 9/1991 | Yeh | 437/43 |
| 5,058,069 | 10/1991 | Gaultier et al. | 365/200 |
| 5,099,451 | 3/1992 | Sourgen et al. | 365/185 |
| 5,436,479 | 7/1995 | Devin | 257/317 |

FOREIGN PATENT DOCUMENTS

| | | |
|---|---|---|
| 0183235A3 | 6/1986 | European Pat. Off. . |
| 0443515A2 | 8/1991 | European Pat. Off. . |
| 2059680 | 4/1981 | United Kingdom . |
| 2073484 | 10/1981 | United Kingdom . |
| 2077492 | 12/1981 | United Kingdom . |

OTHER PUBLICATIONS

Bursky, "ISSCC" Electronic Design, vol. 32, No. 4, Feb. 1984, pp. 104–127.

T. Nozaki et al., "A 1 Mbit EEPROM with MONOS Memory Cell for Semiconductor Disk Application" Proceedings of the Symposium on VLSI Circuits Honolulu IEEE, Sep. 7, 1990, pp. 101–102.

*Primary Examiner*—John Niebling
*Assistant Examiner*—Richard A. Booth
*Attorney, Agent, or Firm*—Robert Groover; Betty Formby

[57] ABSTRACT

The invention relates to a novel electrically programmable and erasable memory cell.

The cell comprises a single transistor, which is a floating gate transistor and has no selection transistor. Means are provided for establishing a high capacitive coupling between the drain (12) and the floating gate (18). The capacitive coupling between the source (10) and the floating gate is low, as is normally the case. Preferably, the control gate (22) only partly covers the floating gate (18). Another part of the floating gate is covered by a semiconductor layer (26) connected to the drain. It is the latter layer which establishes the high capacitive coupling according to the invention. Programming can then take place by the Fowler-Nordheim effect with the source under high impedance, i.e. without hot electron effect.

4 Claims, 1 Drawing Sheet

METHODS FOR FABRICATING AND OPERATING ELECTRICALLY ERASABLE AND PROGRAMMABLE INTEGRATED CIRCUIT MEMORY

This is a divisional application of Ser. No. 07/974,429, filed Nov. 12, 1992, now U.S. Pat. No. 5,436,479.

BACKGROUND OF THE INVENTION

1. Field of the Invention

The invention relates to integrated circuit memories and more particularly non-volatile memories, which use as the elementary information storage cell a floating gate transistor.

2. Description of the Prior Art

In such memories, a floating gate covers a field effect transistor channel, and a control gate covers the floating gate. The floating gate is insulated from the control gate and from the channel by thin insulating layers. The electrical programming and erasing of the memory consist of an injection and an extraction of electrons from the floating gate across the insulant. As a function of the quantity of charges trapped in the floating gate, the minimum reading voltage which it is necessary to apply to the control gate to make the transistor conductive (or conversely to block it) is of varying size. With a fixed reading voltage applied to the floating gate, it is consequently possible to determine what is the state (programmed or unprogrammed) of the transistor. This state represents the binary information stored in the transistor.

In order to form memories able to store a certain information quantity, said cells are arranged in matrix networks or arrays, the cells being arranged in column and line/row form. All the cells of the same line are connected to the same line conductor (generally known as a word line) and all the cells of the same column are connected to the same column conductor (generally called the bit line). The word line is used for designating the cells of a given line. The bit line is used for reading or writing an information in the cell, which is located at the junction of the bit line and the designated word line.

In order that the cells can in this way be organized as a matrix network, there must be a possibility of performing an operation on a given cell without affecting the non-designated cells. This means that it must be possible to apply given potentials to a single cell, across the bit line and the word line which intersect at the location of said cell, without the potentials applied to the other cells of the same word line or the same bit line affecting said other cells. If this were not the case, it would not be possible to have individual access to the informations contained in the different cells.

In the existing industrial procedure, use is made of two major principles for producing electrically programmable and erasable floating gate memories, which can be organized in matrix network form and which can be individually selected within said network.

The first principle is that of electrically programmable and erasable memories or EEPROM. These memories are programmed and erased by the application of an electric field across a very thin oxide separating the floating gate from the channel. The electric charges pass through the insulating layer by the Fowler-Nordheim effect. The transistor is not conductive during programming or erasing. The charge passage direction (erasing or programming) is defined by the direction of the field applied. The field is applied by raising the control gate to a high potential (approximately 20 volts) and the drain to earth or ground, or vice versa. The source is at earth for the injection of electrons into the floating gate and is under high impedance for electron extraction.

If this transistor was used as the memory cell, it would not be possible to organize a matrix network of individually programmable and erasable cells, because it would not be possible to apply the programming or erasing voltages to the drain or the floating gate across a bit line or a word line connected to other cells without programming or erasing said other cells at the same time.

This is the reason why, for conventional EEPROM memories, the cell is constituted by the series arrangement of a floating gate transistor and a selection transistor. The gate of the selection transistor is controlled by the word line and not by the floating gate transistor. Under these conditions it becomes possible to select the reading or writing of a floating gate transistor by deselecting the other cells. Making the selection transistor conductive authorizes the application of a given drain voltage to the transistors of an entire line, but a high control gate or drain voltage is only applied to the desired column.

The other category of memory cells, which is used industrially and which can be organized into a matrix network is the EPROM. The floating gate transistor is used alone and there is no selection transistor. However, programming takes place by the so-called "hot carrier" effect, i.e. it is not sufficient to apply a high electric field of the channel to the floating gate to enable the electrons to pass and instead said electrons must be accelerated beforehand in the conductive channel in order to acquire an adequate energy. Therefore programming takes place by applying a high voltage simultaneously to the drain and the control gate, the source being grounded or earthed. The transistors of the other lines, which do not have a high voltage on their gate, and the transistors of the other columns, which do not have a high voltage on their drain, are not programmed and are also not erased.

For erasing purposes, in the case of so-called flash EPROM memories, high positive voltage pulses are applied to the drain or source, whilst keeping the control gate earthed. However, there is a total erasure and individual access to the different cells is not possible. If absolutely necessary, the memory could be subdivided into separately erasable sectors.

Both EPROM's and EEPROM's suffer from disadvantages, which it would be desirable to eliminate or at least reduce.

EPROM's consume a large amount of current on programming, due to the need of making the transistors conductive under high voltages. It is necessary to have both a high voltage (7 to 15 V) and a high current (approximately 1 milliampere per cell). The high voltage can be supplied from the outside, but this requires the memory user to provide said supply, in addition to the standard low voltage supply necessary for operation outside the programming phase. Alternatively the high voltage is produced by a charging pump within the integrated circuit. However, it is difficult to produce a charging pump producing both a high voltage and a high current. Moreover, it is only possible to program a small number of cells at once, if destructive currents are to be avoided. This can cause a significant problem during the testing of memories, because the manufacturer cannot devote an excessive testing period to each circuit. Finally, EPROM's suffer from the disadvantage of requiring a programming cycle in two stages. Thus, it is not possible to program an information word without having previously completely erased the memory, because it is not possible to erase an individual cell.

EEPROM's suffer from none of these disadvantages. However, they have larger overall dimensions due to the selection transistor necessarily associated therewith when arranged in matrix network form.

An object of the invention is to propose a novel memory cell, which to the greatest possible extent obviates the disadvantages of the prior art cells.

SUMMARY OF THE INVENTION

The invention proposes a memory cell incorporating a floating gate transistor having a source, a drain, a floating gate and a control gate, which is characterized in that it has means for establishing high capacitive coupling between the drain and the floating gate.

According to the invention, the capacitive coupling between the drain and the floating gate is chosen sufficiently high, in accordance with the explanations provided hereinafter, to make it possible to individually program the cells without having to use injection by hot carriers, even when the cells are organized in matrix network or array form with the gates of transistors of the same row or line all being connected together and the drains of the transistors of the same column being all connected together.

Therefore, according to the invention, as a result of a much high floating gate-drain capacitive coupling than for the industrially used EPROM's and EEPROM's, it is possible to program the cells according to the same principle as EEPROM's, i.e. without the high EPROM and flash EPROM current consumption and without any need to have a selection transistor for the matrix network organization.

The capacitive coupling can be high according to two possible criteria, optionally measured simultaneously. On the one hand it can be high compared to the capacitive coupling between the source and the floating gate (approximately at least twice higher). On the other hand it can be high compared with the capacitive coupling between the control gate and the floating gate, at least equal or almost equal to the latter, whereas in the prior art the coupling between the control gate and the floating gate is the much higher.

Preferably, the increased capacitive coupling is brought about by means of a conductive layer or a semiconductor layer in contact with the drain and partly covering the floating gate at a location where the latter is not covered by the control gate. However, other arrangements could be envisaged, e.g. with a floating gate covering part of the drain.

In a technology with two polycrystalline silicon levels, the floating gate is produced with the aid of the first level, whilst the control gate and a layer portion connected to the drain are produced with the aid of the second level above the floating gate.

BRIEF DESCRIPTION OF THE DRAWINGS

Other features and advantages of the invention can be gathered from the following non-limitative description with reference to the attached drawings, wherein show.

DETAILED DESCRIPTION OF THE INVENTION

Figure 1:
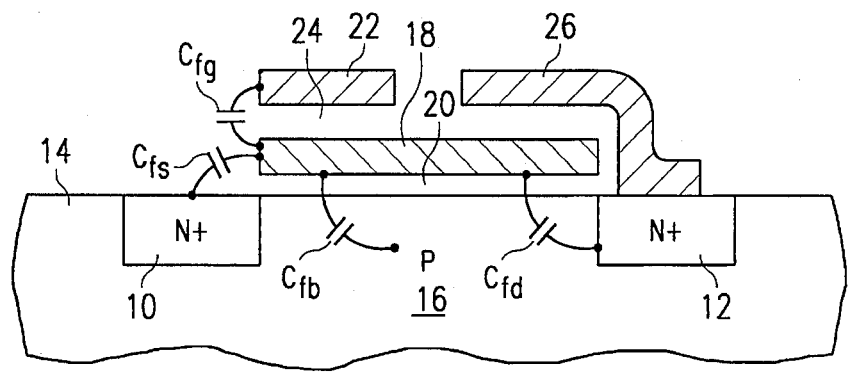
FIG. 1 The general principle of the invention.

The principle of the memory cell according to the invention can be gathered from FIG. 1. The cell has a single transistor, i.e. a single channel between a source region 10 and a drain region 12. The source and drain are e.g. obtained by N-type diffusions in a P-type conductive substrate 14. The surface part of the substrate between the source 10 and the drain 12 then constitutes the transistor channel 16.

The transistor is a floating gate transistor, the channel 16 being entirely covered by a floating gate 18, which is separated from the channel by a very thin insulating layer 20. A control gate 22 at least partly covers the floating gate and is separated therefrom by a thin insulating layer 24.

In conventional EEPROM or EPROM transistors, the arrangement is generally such that the capacitive coupling between the floating gate and the source and the capacitive coupling between the floating gate and the drain are small compared with the capacitive coupling between the floating gate and the control gate. For this purpose the arrangement is generally such that the control gate totally covers the floating gate (maximum coupling) and the edges of the floating gate are self-aligned with the edges of the source and drain regions, so that there is a minimum coverage of the source and drain by the floating gate (minimum coupling). However, it is obvious that the coupling still has a non-negligible value, because it is not possible to remove the drain from the floating gate, because the injection of electrons into the latter must take place across a very thin insulating gap between the drain and the floating gate.

According to the invention it is proposed to voluntarily establish a high capacitive coupling between the floating gate and the drain. However, a weak coupling is retained between the floating gate and the source.

In the embodiment shown, this high capacitive coupling is obtained by a conductive layer portion 26 covering part of the floating gate 18 at a location of the latter not covered by the control gate 22. This conductive layer 26 is separated from the floating gate by a thin insulating layer, preferably a portion of the layer 24 covering the floating gate.

The floating gate is by definition insulated from any other point with respect to direct currents, with the exception of the very weak current flowing during a programming or erasing operation. Consequently, it is generally possible to calculate the potential of the floating gate simply on the basis of capacitive couplings existing between said gate and adjacent areas raised to variable potentials by the control circuits of the transistor.

The floating gate is surrounded by the source, the drain, the control gate and the substrate. There is a natural capacity between the gate and each of the zones. The sum of all these capacities is arbitrarily considered as having a unity value. In other words, it will be assumed that the indicated capacities are measured in units corresponding to the sum of the values of the capacities connecting the floating gate to other points. The term "capacity" or "capacitive coupling" between the floating gate and a given point will be used in arbitrary manner for designated the value of the capacity existing between said gate and said point, measured in said particular unit.

If $C_{df}$ is the capacity between the drain and the floating gate, $C_{sf}$ the capacity between the source and the floating gate, $C_{gf}$ the capacity between the control gate and the floating gate and $C_{bf}$ the capacity between the substrate and the floating gate, with $C_{df}+C_{sf}+C_{gf}+C_{bf}=1$ capacitive unit, it is possible to calculate the voltage present on the floating gate as a function of the drain (Vd), source (Vs), control (Vg) and substrate (Vb) voltages.

Thus, the voltage Vf of the floating gate is the sum of these various voltages weighted by the different respective capacitive couplings: Vf=(Cdf·Vd+Csf·Vs+Cgf·Vg Cbf·Vb)/1 capacitive unit.

It is clear that this explanation is simplified. Thus, the substrate voltage below the floating gate is not uniform and in actual fact the channel must be broken down into small portions raised to given potentials and take account of the capacitive coupling of each of these portions. However, the invention will be better understood on the basis of this simplified explanation. However, use could be made of simulation aids for improving the calculations in the production of a specific structure.

Moreover, in order to be able to give a practical example of the principle of the invention without entering into complex calculations, it will also be assumed that the capacitive coupling between the gate and the substrate is small compared with the sum of the capacitive couplings with the source, the drain and the control gate. Thus, the following simplifying hypothesis will be made:

$$Vf = Cdf \cdot Vd + Csf \cdot Vs \; Cgf \cdot Vg \quad (1)$$

Finally, if the cell is programmed, a charge Q is stored on the floating gate and the equation is modified in the following way:

$$Vf = Cdf \cdot Vd \; Csf \cdot Vs + Cgf \cdot Vg + Q \quad (2)$$

(the absence of apparent homogeneity of this equation is clearly due to the fact that the sum of the capacities is equal to unity); Q then representing the potential assumed by the floating gate if the other electrodes are at zero. Q also represents the voltage which it is necessary to ad to the potential of the floating gate on calculating said potential by equation 1 in the case of a programmed cell. In practice Q is negative and it is necessary to subtract a value of one or more volts from the potential calculated by the equation 1.

As a numerical example, it will be assumed that the capacitive couplings are as follows:

Cdf=0.5

Csf=0.25

Cgf=0.25

Thus, it is clear that a strong floating gate/drain capacitive coupling has been chosen, because it is higher than the coupling between the control gate and the floating gate, which is not the case in conventional EPROM's and EEPROM's, where the coupling between the two gates would be approximately 0.7 and the coupling with the drain or source approximately 0.1 to 0.2.

In order to retain the conventional programming, erasing and reading voltages, it will be assumed that:

1. In programming, the drain voltage is 10 V, the control gate voltage 12 V and the source is under high impedance. However, the source can be considered as being highly capacitively coupled to earth in such a way that in practice its potential can be considered as very close to zero.

2. In erasing, the drain is at high impedance, but is also considered to be strongly capacitively coupled to earth and therefore with a potential close to zero, the control gate is earthed and the source is at 10 V. Erasing can be carried out by applying a succession of abrupt voltage pulses to the source.

3. In reading, the drain is raised to approximately 2 V, the control gate is at 5 V and the source is earthed.

These values are only given in an exemplified manner for illustrating the invention.

To enable the memory to operate in a network with individually programmable and readable cells, it is necessary for these voltages to be applicable to row and column conductors in such a way that the programming takes place on a single cell (at the intersection of a row and a column) without disturbing the others. This also applies on reading. On erasing, it is not indispensable for the cells to be individually erased.

Thus, the cells will be placed in a network with line conductors (word lines) connecting each of the control gates of all the transistors located on the same line and column conductors (bit lines) connecting each of the drains of all the transistors located on the same column (standard arrangement for an EPROM).

So that the desired operation is possible, it is necessary for the programming to take place for the cell, which has its word line at 12 V and its bit line at 10 V. It is necessary to be able to apply to the other word lines voltages such that the other cells of the same bit line are not programmed. Finally, it must be possible to apply to the other bit lines voltages such that the cells of the same word line are not programmed. A priori, the not selected word lines will be connected to earth, in the same way as the unselected bit lines.

In the numerical example chosen, it will be considered that programming of the cell takes place by injecting electrons into the floating gate as soon as there is a voltage of more than 7 V between said gate and the source or drain. It will be considered that there is no programming below 7 V. This is quite realistic for an injection of electrons through a silicon oxide layer with a thickness of about 100 Angstroms. Conversely, it is considered that there is erasing as from 7 V in the other direction. There is no erasing or programming by injecting or extracting electrons between the floating gate and the control gate, even for a voltage exceeding 7 V, because the insulating layer 24 is thicker than the layer 20. These values are given in exemplified manner for illustrating the invention.

1. PROGRAMMING

It is therefore necessary to calculate the voltage Vf of the floating gate on the basis of the previously given formula, on the basis of capacitive couplings and drain (Vd), source (Vs) and control gate (Vg) voltages, both for a selected cell (to check that it can be programed) and for unselected cells (to check that they will not be programmed or erased).

1a. Selected cell

Vd=10 V, Vs=0 V, Vg=12 V, so that Vf=0.5.Vd+0.25.Vs+ 0.25.Vg with the chosen capacitive coupling values, i.e. Vf=8 V. The presence of a=voltage of 8 V between the source and the floating gate causes the injection of electrons between the edge of the source and the edge of the floating gate. The selected cell is programmed.

1b. Totally deselected cell

These are the cells which are not located on the same bit line or on the same word line. Therefore these cells have both their drain and their control gate at earth and their source under high impedance. Their floating gate remains at 0 V and will not be programmed.

1c. Cell deselected solely by the control gate

These are cells located on the same bit line (drain at 10 V), but not on the same word line (control gate at 0 V): Vd=10 V, Vs=0, Vg=0, so that Vf=5 V.

The maximum voltage between the gate and another point is max. 5 V and there is no programming.

1d. Cell deselected solely by the drain

These are cells which are on the same word line (gate at 12 V), but not on the same bit line (drain at 0 V): Vd=0 V, Vs=0, Vg=12 V, so that Vf=3 V.

The maximum voltage between the floating gate and the drain or source is only 3 V and there is no programming.

It is also possible to check that if the cell has been programmed beforehand, an attempt to program other cells will not erase it. For this purpose it is possible to recalculate the voltage values and the potential differences by subtracting e.g. 1.5 V from Vf, which represents a realistic evaluation of the negative potential component Q intrinsically due to the negative charge stored on the floating gate (cf. formula (2)). It can be established that there is no problem.

2. ERASING

The above reasoning for the programing of a selected cell can also apply to the erasing of a cell.

2a. Selected cell

Vd=0, Vs=10 V, Vg=0, i.e. Vf=2.5 V.

There are 7.5 V between the source and the floating gate in a direction appropriate for erasing. The source voltage can be applied in the form of repeated pulses and the cell is erased.

2b. Cell deselected by the gate

If the unselected word lines are raised to 12 V, it will be possible to prevent the erasing of the cells of said lines, i.e.: Vd=0, Vs=10 V, Vg=12 V, thus Vf=5.5 V.

The maximum voltage is 5.5 V between the floating gate and the drain, in a direction appropriate for erasing, but inadequate for carrying out the latter.

2c. Cell deselected by the drain

It is not possible to deselect cells by applying a voltage to the drain of not selected columns. There would be a risk of programming cells of said columns (cells which are on the selected word line) if the voltage on the drain is the same as the source voltage and the transistors of virtually the entire memory plane would be rendered conductive if the drain voltage is different from the source voltage. The drain must be left under high impedance. Thus, erasing can be carried out line by line, which is quite satisfactory (erasing in the flash EPROM can only take place on a total basis or by entire sectors of the memory plane). The lines which it is not wished to erase are e.g. raised to 10 or 12 V.

However, it is also possible here to choose to carry out a total or sector-wise erasure by applying 10 V to the source of an entire sector and placing at 0 V all the word lines of the memory plane. As in flash EPROM's, sector-wise erasure is only possible if the sources of the transistors corresponding to a given sector are insulated from those or other sectors.

3. READING

It must also be possible to check whether it is possible to read the cells individually. For this purpose, it is assumed that the voltage threshold VT1 to be applied to the floating gate to make the transistor conductive is approximately VT1=2 V. It is also assumed that the potential component induced on the floating gate as a result of the negative charge thereof when it is programmed is Q=−1.5 V, cf. the above formula (2). The word line is raised to 5 V (Vg=5 V) and the bit line to 2 V (Vd=2 V) for the selected cell to be read. The source is earthed or grounded (Vs=0). These values are given for information purposes. The other word lines are left at 0, as are the other bit lines.

Reading consists of measuring the current on the bit line. This current must exist when the cell is not programmed, but not when it is programmed. It is therefore necessary for the voltage on the floating gate to exceed the threshold voltage VT1 of the transistor when it is not programmed and remains below this when it is programmed. It is also necessary for the unselected cells, either because their word line is earthed, or because their bit line is earthed, have their floating gate at a voltage below VT1.

3a. Selected cell

Vd=2 V, Vs=0, VG=5 V, so that Vf=2.25 V for an unprogrammed cell or Vf=2.25 V−Q=0.75 V for a programmed cell.

Vf exceeds VT1 (2 V) for an unprogrammed cell and a current flows. However, if Vf is below VT1 for a programmed cells, no current flows. It is therefore possible to read the state of the cell.

3b. Totally deselected cell

These are cells connected simultaneously to earthed bit lines and earthed word lines: Vd=0, Vs=0, Vg=0, so that Vf=0 for an unprogrammed cell, or Vf=−1.5 V for a programmed cell and no current can pass no matter what the state of the cell.

3c. Cell deselected by the gate

The word line and therefore the control gate is earthed, but the drain is at 2 V: Vd=2 V, Vs=0, Vg=0, so that Vf=1 V, below VT1 for an unprogrammed cell and a fortiori below for a programmed cells and no current can pass no matter what the state of the cell.

3d. Cell deselected by the drain

The bit line and therefore the drain is earthed and the word line is at 5 V: Vd=0, Vs=0, Vg=5 V, so that Vf=1.25 V, below VT1 for an unprogrammed cell and a fortiori below for a programmed cell and no current can pass no matter what the state of the cell.

Thus, it is possible to individually read the programmed or unprogrammed state of each cell without causing interference on or coming from the other cells.

The conclusion of these calculations is that it is possible to find potential conditions making it possible to individually read or programme the cells in a simple matrix organization without adding a selection transistor for each floating gate transistor. This is possible due to the existence of a strong capacitive coupling between the drain and the floating gate.

Obviously it is not possible here to give all the appropriate potential and capacitive coupling values. They are in particular dependent on the conditions of injecting or extracting electrons through the insulating layer 20.

However, it is apparent from what has been stated hereinbefore, how each source, drain or gate potential influences the potential of the floating gate and how it is possible to consequently determine the selection, deselection, programming, erasing or reading conditions.

In a very general manner, it can be stated that operating conditions are possible as soon as the floating gate-drain coupling is relatively high compared with the floating gate-source coupling. The control gate-floating gate coupling is proportionally reduced compared with the situation in conventional EPROM's or EEPROM's.

For the practical realization of such a memory cell, it would be possible to use a conventional two polycrystalline silicon level technology.

The floating gate is formed by the first polycrystalline silicon level on an insulating layer with a thickness of about 100 nanometers. It is then covered by an insulating layer with a thickness of a few 100 nanometers. The second polycrystalline silicon level is deposited and forms on the one hand the control gate and on the other a conductive layer portion connected to the drain.

Figure 2:
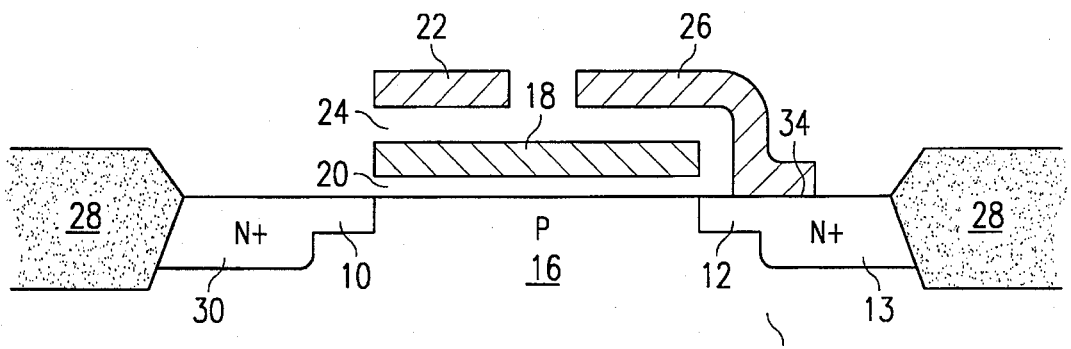
FIG. 2 A cross-section of a specific embodiment.
Figure 3:
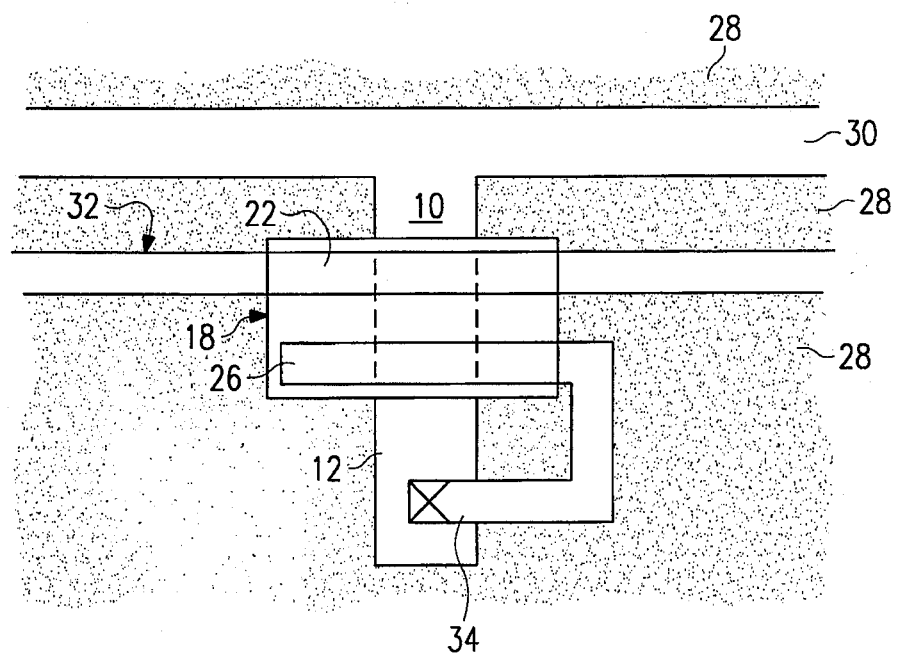
FIG. 3 A plan view of the configuration of the cell of FIG. 2.

A practical embodiment is shown in FIG. 2, with the topography of the cell in plan view given in FIG. 3.

Each transistor is produced in an active area of a P-type silicon substrate. The active area is defined by the thick silicon oxide 28 formed by local oxidation of the substrate.

The sources of all the transistors of the matrix network or a sector of the latter are all connected by source lines 30, formed between thick silicon oxide areas 28. These lines are deep diffusions with a conductivity type opposite to that of the substrate. In the present case, the source lines extend horizontally in FIG. 3 and parallel to the memory word lines.

The actual sources 10 of the transistors are produced for each individual transistor by a local extension of the source line (downward extension in FIG. 3). The sources 10 are produced by N-type impurity implantations, which are shallower than the diffusions 30. These implantations are produced following the formation of the gates of the transistors, so that their edges are self-aligned with the edges of the floating gate.

The drains 12 can also be in two parts, namely a deep diffusion 13 and a less deep implantation self-aligned with the floating gate. The less deep part can be in particular used for receiving a not shown contact with a bit line connecting the drains of all the transistors of the same column. This line would extend vertically in FIG. 3.

The floating gate is a rectangle 18 in FIG. 3. It is a portion of a first level polycrystalline silicon layer. Between the source 10 and the drain 12, beneath the floating gate, extends the P-type channel 16 of the transistor. Laterally, said channel is defined by thick oxide 28 up to which rise the edges of the gates (in a manner not visible in the section of FIG. 2, because this extends longitudinally, on a vertical line of FIG. 3).

The word line is a polycrystalline silicon line (second level), which runs horizontally from one transistor to the next and which passes above part of the floating gate so as to constitute at this point the transistor control gate 22.

Alongside said control gate and also covering part of the floating gate, there is another part 26 of the second polycrystalline silicon level. It serves to increase significantly the capacitive coupling between the drain and the floating gate and for this purpose it is connected to the drain. The total capacitive coupling results from the addition of the direct convention coupling between the drain and the floating gate and the supplementary coupling linked with the part 26. Conversely, on the side of the source, there is no specific means for increasing the coupling. There is only the conventional direct coupling between the source and the floating gate, resulting from the need of having the source very close to the floating gate.

The floating gate 18 is separate from the channel 16 by a silicon oxide layer 20 having a thickness of about 100 nanometers. The control gate and the part 26 are separated from the floating gate by a layer 24 having a silicon oxide thickness of a few hundred nanometers.

As can be seen in the drawing, the part 26 is connected to the drain and passes round the latter, the part 26 being U-shaped. Contact with the drain takes place at a location not immediately juxtaposed to the floating gate.

The reason for this arrangement is the technology of producing the drain by ion implantation self-aligned with the gate. The portion 26 must not mask the drain when the latter is implanted, i.e. following the deposition and etching of the two polycrystalline silicon levels.

The contact of the region 26 with the drain can take place in several different ways, e.g. a metallization can come into contact with both of them. This is possible by using the contact between the not shown metal bit line and the drain. It is also possible for the layer portion 26 to be directly contacted with the substrate and serve as a dopant source (because it will be in principle strongly N-type doped) for the substrate, so as to produce a contact within the substrate with the drain, which will be immediately adjacent. The diffusion in the substrate from the contact 34 between the layer 26 and the substrate then makes it possible to bring about a N-type doping continuity between the diffused deep part and the shallow part (implanted with self-alignment) of the drain zone and in addition said contact electrically connects the part 26 to the drain.

I claim:

1. A method for fabricating an integrated circuit memory cell, comprising the steps of:
    (a) providing a body of monocrystalline semiconductor material;
    (b) forming a patterned field insulation layer which exposes said semiconductor material in a location to provide an active area of a first conductivity type;
    (c) forming a gate insulation layer over said active area and a first thin film conductor layer over said gate insulation layer; and patterning said first conductor layer to provide, in each memory cell location, a laterally isolated floating gate which crosses said active area to define a channel region;
    (d) implanting said active area, where not covered by said first conductive layer, with dopants of a second conductivity type, to form source extension and drain extension diffusions in said active region on opposite sides of said channel region;
    (e) implanting second conductivity type dopants, at higher dose and energy than said implanting step (d), to form a source diffusion which is continuous with said source extension, and a drain diffusion which is continuous with said drain extension;
    (f) forming an interlevel insulation layer over said first conductor and a second thin film conductor layer over said interlevel insulation layer, and patterning said second conductor layer to provide, in each location of a memory cell: a portion of said second conductor layer which overlies and is capacitively coupled to said floating gate, and which is laterally extended to define a control gate; and another portion of said second conductor layer which overlies and is capacitively coupled to said floating gate, and which is electrically connected to said drain to define a drain coupling element, and is otherwise isolated.

2. The method of claim 1, wherein said first conductivity type is P-type, and said second conductivity type is N-type.

3. The method of claim 1, wherein said semiconductor material consists essentially of silicon.

4. The method of claim 1, wherein said first and second thin film conductor layers consist essentially of polycrystalline silicon.

* * * * *